US010241136B2

United States Patent

(12) United States Patent
Rostron et al.

(10) Patent No.: US 10,241,136 B2
(45) Date of Patent: Mar. 26, 2019

(54) HIGH VOLTAGE CAPACITOR CURRENT MONITOR

(71) Applicants: Joseph R Rostron, Hampton, GA (US); Josh Keister, Hampton, GA (US); Tan Tran, Hampton, GA (US); Karl Fender, Hampton, GA (US)

(72) Inventors: Joseph R Rostron, Hampton, GA (US); Josh Keister, Hampton, GA (US); Tan Tran, Hampton, GA (US); Karl Fender, Hampton, GA (US)

(73) Assignee: Southern States, LLC, Hampton, GA (US)

( * ) Notice: Subject to any disclaimer, the term of this patent is extended or adjusted under 35 U.S.C. 154(b) by 0 days.

(21) Appl. No.: 15/696,793

(22) Filed: Sep. 6, 2017

(65) Prior Publication Data

US 2018/0210012 A1 Jul. 26, 2018

Related U.S. Application Data

(60) Provisional application No. 62/448,567, filed on Jan. 20, 2017.

(51) Int. Cl.
*G01R 1/04* (2006.01)
*H01G 4/14* (2006.01)
(Continued)

(52) U.S. Cl.
CPC ............ *G01R 15/06* (2013.01); *G01R 19/25* (2013.01); *G01R 31/028* (2013.01); *G01R 31/08* (2013.01);
(Continued)

(58) Field of Classification Search
CPC ...... G01R 15/06; G01R 31/08; G01R 31/028; G01R 19/25; G01R 1/04; H04Q 9/00; H02H 3/10; G08C 17/02; H01G 4/14
(Continued)

(56) References Cited

U.S. PATENT DOCUMENTS 4,536,704 A * 8/1985 Burkum .............. G01R 31/028 324/529
2006/0170432 A1 8/2006 Adolfsson et al.
(Continued)

OTHER PUBLICATIONS

PCT/US2018/014574 International Search Report (ISR).

*Primary Examiner* — Farhana A Hoque
(74) *Attorney, Agent, or Firm* — Mehrman Law Office; Michael J. Mehrman

(57) ABSTRACT

A high voltage capacitor current monitor that attaches to a bushing on the exterior of a capacitor container (commonly referred to as a "can"). The capacitor current monitor, which draws operating power from the power line, detects the current flowing through the high voltage capacitor and can be used as part of a capacitor status monitor to detect internal failures down to the level of a single capacitor pack. The monitor may include a radio transmitter and/or a visual status indicator, such as an electronic flag, indicating the detection of a fault or capacitor failure. The current monitor may also include a power supply current transformer providing power to the monitor from the power line. Capacitor current measurements may be communicated with a remote transmission unit (RTU), which communicates with a central control station that schedules capacitor maintenance based on the data received from the status monitors.

19 Claims, 17 Drawing Sheets

12 Canister Status Monitor
35 Internal Current and Voltage Monitors
30 Capacitor Bank
10 Monitored Capacitor Canister (Can)
16 Impedance Detector
17 Visual Indicator
37 Sensor Panel (FIG. 3B)
34 Capacitor Segment
32A Phase A
32B Phase B
32C Phase C
36 RTU
38 Controller, Response Equipment
39 SCADA

(51) Int. Cl.

| | |
|---|---|
| ***H02H 3/10*** | (2006.01) |
| ***G01R 15/06*** | (2006.01) |
| ***G01R 19/25*** | (2006.01) |
| ***G01R 31/08*** | (2006.01) |
| ***G08C 17/02*** | (2006.01) |
| ***G01R 31/02*** | (2006.01) |
| ***H04Q 9/00*** | (2006.01) |

(52) U.S. Cl.
CPC .............. *G08C 17/02* (2013.01); *H01G 4/14* (2013.01); *H02H 3/10* (2013.01); *H04Q 9/00* (2013.01); *G01R 1/04* (2013.01)

(58) Field of Classification Search
USPC .................................................. 324/529, 548
See application file for complete search history.

(56) References Cited

U.S. PATENT DOCUMENTS

| | | | |
|---|---|---|---|
| 2006/0279887 | A1 | 12/2006 | Lu et al. |
| 2008/0077336 | A1 | 3/2008 | Fernandes |
| 2009/0167315 | A1 | 7/2009 | Lindsey |
| 2014/0167740 | A1 | 6/2014 | Gilbert |
| 2016/0041203 | A1 | 2/2016 | Rostron |

* cited by examiner

HIGH VOLTAGE CAPACITOR CURRENT MONITOR

REFERENCE TO RELATED APPLICATION

This application claims priority to commonly owned U.S. Provisional Application Ser. No. 62/448,567 entitled "High Voltage Capacitor Monitor and Maintenance System" filed on Jan. 20, 2017, which is incorporated by reference.

TECHNICAL FIELD

The present invention is directed to electric power systems and, more particularly, to a current monitor for high voltage capacitors, such as those used for power factor correction on electric power transmission and distribution lines.

BACKGROUND

Electric power capacitors are widely used for power factor correction in electric power substations and along transmission and distribution lines. A typical capacitor bank includes three phase banks, one for each electric power phase. Each phase bank includes one or more segments, which each bank includes one or more canisters or "cans" containing a number of internal capacitor packs. Each capacitor pack, in turn, includes a large number of individual electric capacitors. A relatively small capacitor bank connected to a distribution line may only include one capacitor canister per phase, while a large substation may include several segments, which each include multiple capacitor canisters for each phase. For example, a typical substation capacitor bank may include four segments per phase, where each phase includes six capacitor cans for a total of twenty four canisters in the capacitor bank.

Regardless of the number of canisters in a particular capacitor bank, each capacitor canister serves as the separately connected, replaceable unit that is electrically connected, typically by "jumpers," to an electric power phase (note that a single electric power phase usually includes one conductors or cable, but may include multiple conductors). Each capacitor canister therefore includes two high voltage bushings (also known as insulators) that provide the points of electrical interconnection between the capacitor canister and an electric power phase.

The capacitor packs inside each canister can fail in the ordinary course of operation. Internal fusing typically allows the canister to continue functioning even after an internal capacitor has failed, although the capacitance of the canister will have been reduced. A partially failed capacitor canister connected to only one phase also causes phase imbalance when the capacitor bank is energized. As a general rule, each capacitor canister is typically considered functional when operating with a single internal capacitor failure, and drops out of service requiring replacement when two or more internal capacitors have failed.

In conventional practice, there is no effective way to determine when a capacitor canister has experienced a partial failure, typically involving only one internal capacitor pack, but still remains operational. This is because a partially failed capacitor canister provides no visual indication or easily measured electrical indication of the partial failure. Instead, the conventional practice is to replace a capacitor canister only after it has experienced sufficient internal failures (typically two capacitor failures, which may occur in the same capacitor pack or in two different capacitor packs) to drop out of service, which exposes the system to some period of operation without the capacitor bank in service. At present, there is no economically feasible way for conducting more proactive capacitor canister monitoring, internal fault detection, and replacement.

Present approaches require a technician to take an entire capacitor bank out of service to test each individual canister. Using this approach, capacitor unbalance is detected and canisters are replaced when more than one capacitor pack in a single canister has been determined to have failed based on the measured capacitance of the entire canister. This approach may be too conservative, however, because a capacitor pack with a single failure is typically acceptable, while a single capacitor pack with two or more failed capacitors is prone to explosive failure. It would therefore be desirable to be able to determine whether a multi-capacitor failure has occurred within a single capacitor pack, or whether failed capacitors in a particular canister are distributed among multiple capacitor packs. However, present techniques cannot determine whether two capacitors have failed within a single pack, or whether the failed capacitors are distributed throughout multiple capacitor packs in a particular canister.

In addition, conventional capacitor failure detection techniques identify capacitor failures by measuring capacitive imbalances between the phases. As a result, balanced capacitor failures across the phases tend to re-balance the network and mask the failures, hence producing an apparent good condition leaving a potentially precarious condition undetected. Also, conventional capacitor monitoring techniques require measuring the condition of each capacitor canister while the entire capacitor bank is removed from service, which is time consuming and extends the time that reactive power compensation from the capacitor bank is unavailable. This can be particularly expensive because capacitor failures tend to occur at times of high electricity consumption, when the need for power factor correction by the capacitor bank is high. Testing a large capacitor bank that has experienced a failure typically requires a week or more with entire bank of service for testing, which usually occurs during times of greatest need for the capacitor bank.

There is, therefore, a need for a more effective approach for electric power capacitor monitoring and replacement.

SUMMARY

The present invention may be embodied in a current monitor that attaches to a bushing on the exterior of a capacitor container (commonly referred to as a "can"). The capacitor current monitor, which draws operating power from the power line, detects the current flowing through the high voltage capacitor and can be used as part of a capacitor status monitor to detect internal failures down to the level of a single capacitor pack. The monitor may include a radio transmitter and/or a visual status indicator, such as an electronic flag, indicating the detection of a fault or capacitor failure. The current monitor may also include a power supply current transformer providing power to the monitor from the power line. In a particular embodiment, the microprocessor and radio chip are carried on a main PC board and the current sensor is Rogowski coil printed on a satellite PC board suspended from the main PC board. The power supply current transformer includes a winding carried on a core supported by the housing below the satellite PC board. Capacitor current measurements may be communicated with a remote transmission unit (RTU), which communicates with a central control station that schedules capacitor maintenance based on the data received from the status monitors. A current fault controller utilizes three phase current measurements and signatures characteristic of single-capacitor and multi-capacitor faults to detect capacitor failures within the capacitor canister without utilizing voltage or impedance measurements of the capacitor canister or individual capacitor packs inside the canister.

The current monitor may be utilized as part of a capacitor status monitor that attaches across the bushings on the exterior of a capacitor container (commonly referred to as a "can"). The capacitor status monitor, which may draw power from the current monitor, detects the internal impedance of the capacitor canister to detect internal failures down to the level of a single capacitor pack. The monitor may utilize the radio transmitter and/or a visual status indicator provide by the current monitor. The monitor may also include a power supply current transformer providing power to the monitor from the power line. Capacitor status monitors throughout the capacitor bank may communicate with a remote transmission unit (RTU), which communicates with a central control station that schedules capacitor maintenance based on the data received from the status monitors.

The current transformer (CT) may be deployed together with a capacitor monitor. The CT mounts to one of the bushings of the capacitor canister, and the visual monitor may mount to the CT. The CT may include an internal antenna for communicating with the RTU. The CT typically includes a Rogowski coil printed on a satellite PC board. The monitor may also include a power supply current transformer providing power to the monitor from the power line. In a particular embodiment, the impedance detector determines whether a multi-capacitor failure has occurred within a single capacitor pack, or whether the multi-capacitor failure is distributed among multiple capacitor packs.

It will be understood that specific embodiments may include a variety of features in different combinations, as desired by different users. In view of the foregoing, it will be appreciated that the present invention provides a cost effective high voltage capacitor monitoring system. The specific techniques and structures for implementing particular embodiments of the invention and accomplishing the associated advantages will become apparent from the following detailed description of the embodiments and the appended drawings and claims.

BRIEF DESCRIPTION OF THE FIGURES

The numerous advantages of the invention may be better understood with reference to the accompanying figures in which.

DETAILED DESCRIPTION

Figure 1:
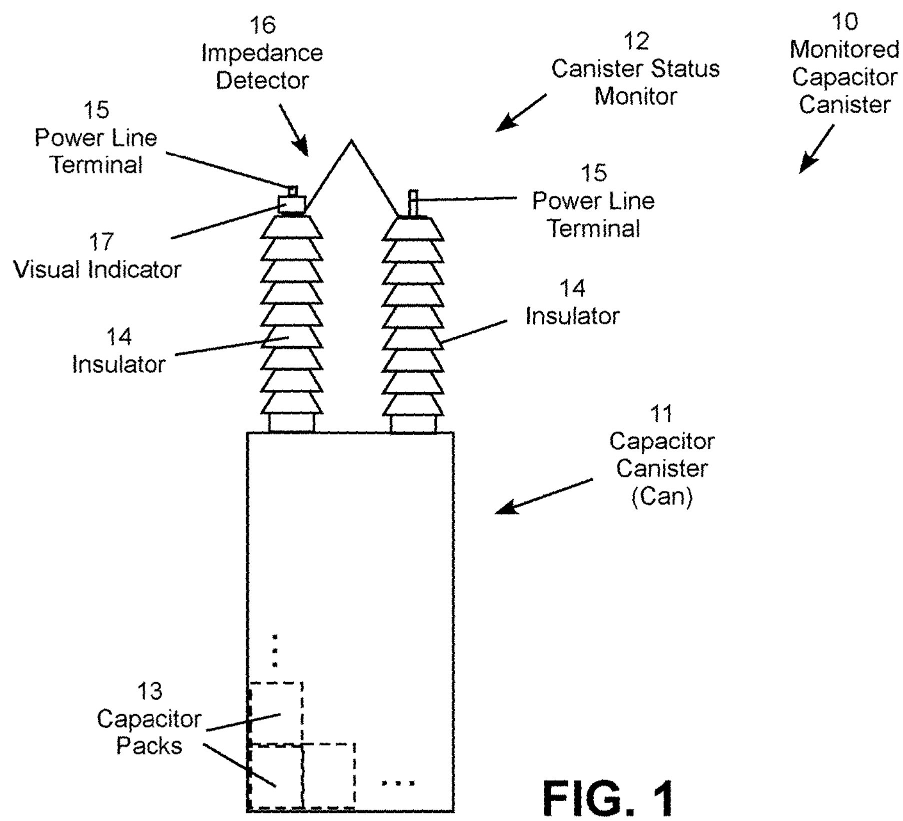
FIG. 1 is conceptual illustration of a high voltage capacitor canister commonly referred to as a "can" with an impedance detector and visual indicator.

The embodiments of the invention include a current monitor that attaches to a bushing on the exterior of a capacitor container (commonly referred to as a "can"). The capacitor current monitor, which draws operating power from the power line, detects the current flowing through the high voltage capacitor and can be used as part of a capacitor status monitor to detect internal failures down to the level of a single capacitor pack. The monitor may include a radio transmitter and/or a visual status indicator, such as an electronic flag, indicating the detection of a fault or capacitor failure. The current monitor may also include a power supply current transformer providing power to the monitor from the power line. In a particular embodiment, the microprocessor and radio chip are carried on a main PC board and the current sensor is Rogowski coil printed on a satellite PC board suspended from the main PC board. The power supply current transformer includes a winding carried on a core supported by the housing below the satellite PC board. Capacitor current measurements may be communicated with a remote transmission unit (RTU), which communicates with a central control station that schedules capacitor maintenance based on the data received from the status monitors. A current fault controller utilizes three phase current measurements and signatures characteristic of single-capacitor and multi-capacitor faults to detect capacitor failures within the capacitor canister without utilizing voltage or impedance measurements of the capacitor canister or individual capacitor packs inside the canister.

The current monitor may be utilized as part of a capacitor canister status monitor that draws operating power from the power line and detects the internal impedance of the capacitor canister to detect internal failures down to the level of a single capacitor pack. The monitor may include a radio transmitter and/or a visual status indicator, such as an electronic flag, indicating the detection of an internal capacitor failure. The monitor may draw power for its electronics from the current monitor, which draws its power form the power line. Capacitor current monitors and status monitors throughout the capacitor bank may communicate with a remote transmission unit (RTU), which communicates with a central control station that schedules capacitor maintenance based on the data received from the status monitors.

The impedance detector is sufficiently accurate to detect the failure of one of the capacitor packs inside the canister, which typically occurs before the canister fails completely. For example, capacitor canisters typically continue to operate with one failed capacitor pack, and drop out of service when two packs have failed. The detector is therefore designed to detect a single-capacitor failure inside the canister before a multiple-capacitor failure causes the canister to drop out of service. The detector includes an antenna and radio transmitter and/or a visual indicator to convey the status of the capacitor canister. The detector status indicates "no detected failure" (e.g., green visual indication) and "partial detected failure" (e.g., green visual indication) before the failure is sufficient to cause the capacitor can to drop out of service.

The PC board carrying the voltage divider typically has a "V" shape and a distance equal to or greater than two and one-half times the distance between first and second power line terminals. The voltage divider and current sensor may be printed conductors carried on the PC board. The current sensor may be mounted on a satellite board positioned adjacent to the PC board. The power supply transformer may be disposed as a separate unit and mounted on one of the power line terminals. The PC board may be configured as an embedded microstrip with a printed conductor positioned between the PC board and a dielectric layer adhered to the PC board. Alternatively, the PC board may be configured as an augmented microstrip with a printed conductor and other electronic components positioned on the PC board covered by a protective dome.

In an embodiment, the capacitor status monitor is configured for a high voltage electric power capacitor canister having a first high voltage bushing carrying a first high voltage power line terminal, and a second high voltage bushing carrying a second high voltage power line terminal. A current sensor detects a current measurement of a current flowing through the capacitor canister. An impedance detector carried on a PC board configured for connection between the first and second power line terminals includes a voltage divider that measures voltage across the first and second power line terminals of the capacitor canister. Electronics including a microprocessor computes an impedance associated with the capacitor canister based on current measurement and the voltage measurement. A power supply transformer induces electric power from the current flowing through the capacitor canister and supplies electric power to the electronics of the capacitor status monitor. A visual indicator displays a status of the capacitor based on the impedance computed by the microprocessor. A radio chip and an antenna transmits information acquired or computed by the microprocessor.

As an option, the capacitor status monitor may include current sensors for detecting current measurements flowing through current packs internal to the capacitor canister. In this embodiment, the capacitor status monitor is further operative to determine whether a multi-capacitor failure has occurred within a single capacitor pack, or whether the multi-capacitor failure is distributed among multiple capacitor packs. In addition, a local controller operative for controlling an electric power switch for disconnecting the current flowing through the capacitor canister based on a disconnect signal from the microprocessor. A remote transmission unit operatively connected to a maintenance system that schedules repair or replacement of the capacitor canister based on a maintenance signal from the capacitor status monitor.

FIG. 1 shows an illustrative monitored capacitor canister 10 including a capacitor canister 11 and a canister status monitor 12. The capacitor canister 11 includes a number of internal capacitor packs 13, which each include a number of individual capacitors. The capacitor canister 11 also includes a pair of high voltage insulators (also known as bushings) 14 that terminate in power line terminals 15. The canister status monitor 12 includes an impedance detector 16 that extends across, and is electrically connected to, the power line terminals 15. As options, the canister status monitor 12 may include a battery and/or a power supply transformer that inductively powers the impedance detector from the power line (e.g., power supply transformer and backup battery). The canister status monitor 12 may also include a visual indicator 17 and/or a current transformer mounted one of the power line terminals. The current monitor may be integral with the impedance detector, for example the current monitor may be disposed on the same PC board as the impedance detector or on a "Rogowski coil" disposed on a satellite PC board suspended from the impedance detector PC board. Alternatively, the current monitor may be configured as a separate unit, such as a puck shaped current sensor unit that may be installed and removed separately from the impedance detector. The visual indicator 17 includes some type of human perceptible indicator designed to be viewed from the distance capacitor banks are normally viewed, such as 50 of 100 feet. An electronic flag, such as a light emitting diode (LED) flag, may be positioned to be visible to a technician on the ground or driving past in a truck. The capacitor status monitor 12 may also includes a radio chip and antenna for wirelessly transmitting monitoring information, typically to a local remote transmission unit (RTU), which relays the information to a central control center. An RFID chip in the monitor or in communication with the monitor may also be used to transmit capacitor status to a technician reading the flags with an RFID reader.

The impedance detector 16 is capable of detecting a single internal capacitor failure occurring within a single capacitor pack 13, which is indicated by the visual indicator 17 and reflected in wireless transmissions. This allows the monitored capacitor canister 10 to be taken out of service and repaired before the unit fails or drops out of service. The onboard canister status monitor 12 also allows a capacitor failure to be readily detected without taking the entire capacitor bank out of service for testing. Instead, a partially-failed canister can be removed and replaced during off-peak hours, and sent to the shop or manufacturer for repair without any on-peak loss of service of the capacitor bank.

Figure 2:
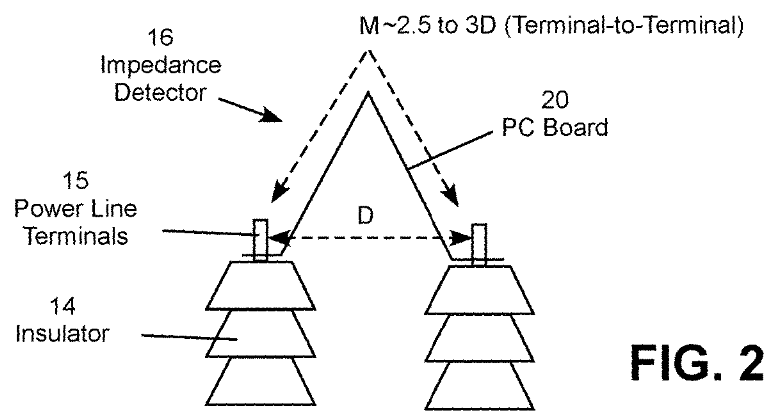
FIG. 2 is a conceptual illustration of the impedance detector showing approximate relative dimensions.

As shown in FIG. 2, the main substrate of the impedance detector 16 is formed on a PC board 20 in a "V" shape that fits onto and electrically connects with the jumper terminals (posts) 15 on the ends of the bushings 14. The "V" shape prevents flashover along the PC board 20 and helps to shed water, snow and debris. The distance "M" along the PC board 20 from terminal-to-terminal is typically 2.5 to 3 times the linear from terminal-to-terminal distance "D" to prevent rain and other contamination from shorting or causing flashover of the capacitor along the outside of the impedance detector. The PC board 20 carries a high impedance segmented conductor connected between the power supply that serves as a voltage divider for voltage measurement while conducting a sensor current in the mill-Amp range. The PC board 20 may also carry one or more additional electronic elements, such as discrete capacitors, inductors, diodes, etc. to impart a desired impedance signature to the detector.

Figure 3A:
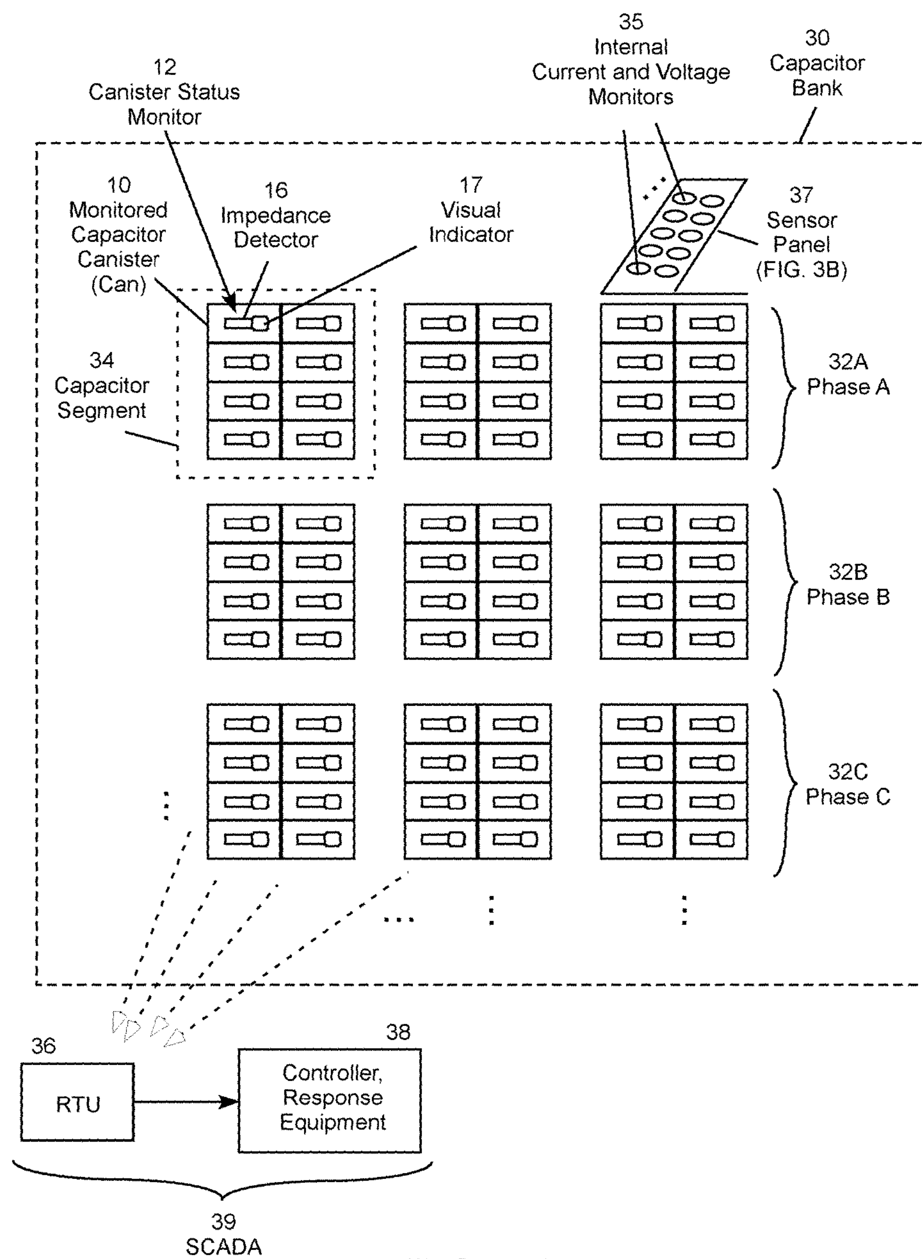
FIG. 3A is a conceptual illustration of a multi-can capacitor bank where each canister includes an impedance detector and visual indicator.

FIG. 3A illustrates three-phase capacitor bank 30 that includes three capacitor phases 32A, 32B and 32C, which each include several capacitor segments. Each phase includes three segments in this particular example. Each capacitor segment 34 includes a number of monitored capacitor canisters 10. Each segment includes eight canisters in this particular example. Each canister has a capacitor canister has an associated status monitor 12 with an impedance detector 16 and a visual indicator 17 and a wireless radio communicating the capacitor monitoring data to a remote transmission unit (RTU), which may operate local control equipment, such as a breaker to disconnect the capacitor bank 30 from the power line, and to relay the monitoring data to a central controller. For example, the RTU and central controller may be part of the Supervisory Control and Data Acquisition (SCADA) system 39 typically utilized by modern electric utilities. This configuration therefore implements local, visual determination of capacitor status as well as remote, central monitoring.

As shown conceptually for one of the capacitor canisters 10, each canister may include additional internal capacitor and voltage sensors 35 (as shown in greater detail in FIG. 3B) connected to the individual capacitor packs 13 inside the canister to provide current and voltage measurements for each individual capacitor pack. The internal capacitor and voltage sensors 35 include wireless transmitters that communicate the current and voltage measurements for each capacitor pack to a suitable location, such as the canister impedance detector 16, which aggregates the data for all of its internal capacitor packs. The impedance detector 16 aggregates the date for its associated canister. A controller in the impedance detector may compute an impedance measurement for the canister and for each capacitor pack within the canister. Alternatively or additionally, the impedance detector may communicate the aggregated data to a controller in an RTU, a local controller, a remote controller, or another other suitable location. Any controller receiving the data my, in turn, compute an impedance measurement for canister and for each capacitor pack within the canister. This allows a capacitor failure to be detected in each capacitor pack individually and response actions to be taken, such as scheduling maintenance to replace a partially failed canister or operating a switch to disconnect a partially failed canister.

The internal capacitor and voltage sensors 35 may be built into the canister 10, housed in a separate sensor panel 37, or located in another suitable location. For example, the sensor panel 37 may be mounted to the outside of the canister case, located in a separate housing that mounts to the canister, mounted in a fuse register or fuse box for the canister, or any other suitable location. The internal capacitor and voltage sensors 35 may include visual indicators, and the sensor panel 37 may be located in a position where it is visible to a technician viewing the panel from the ground. The internal current and voltage measurements allow the impedance of the canister failures down to the capacitor pack level. This allows controller to determine whether a multi-capacitor failure has occurred within a single capacitor pack, or whether the multi-capacitor failure is distributed among multiple capacitor packs. A canister having at most one failed capacitor in any capacitor pack is ordinarily allowed to remain in service and scheduled for replacement during an off-peak period, such as at night. A canister having more than one failed capacitor in any capacitor pack may be immediately disconnected and taken out of service and replaced as soon as possible.

Figure 3B:
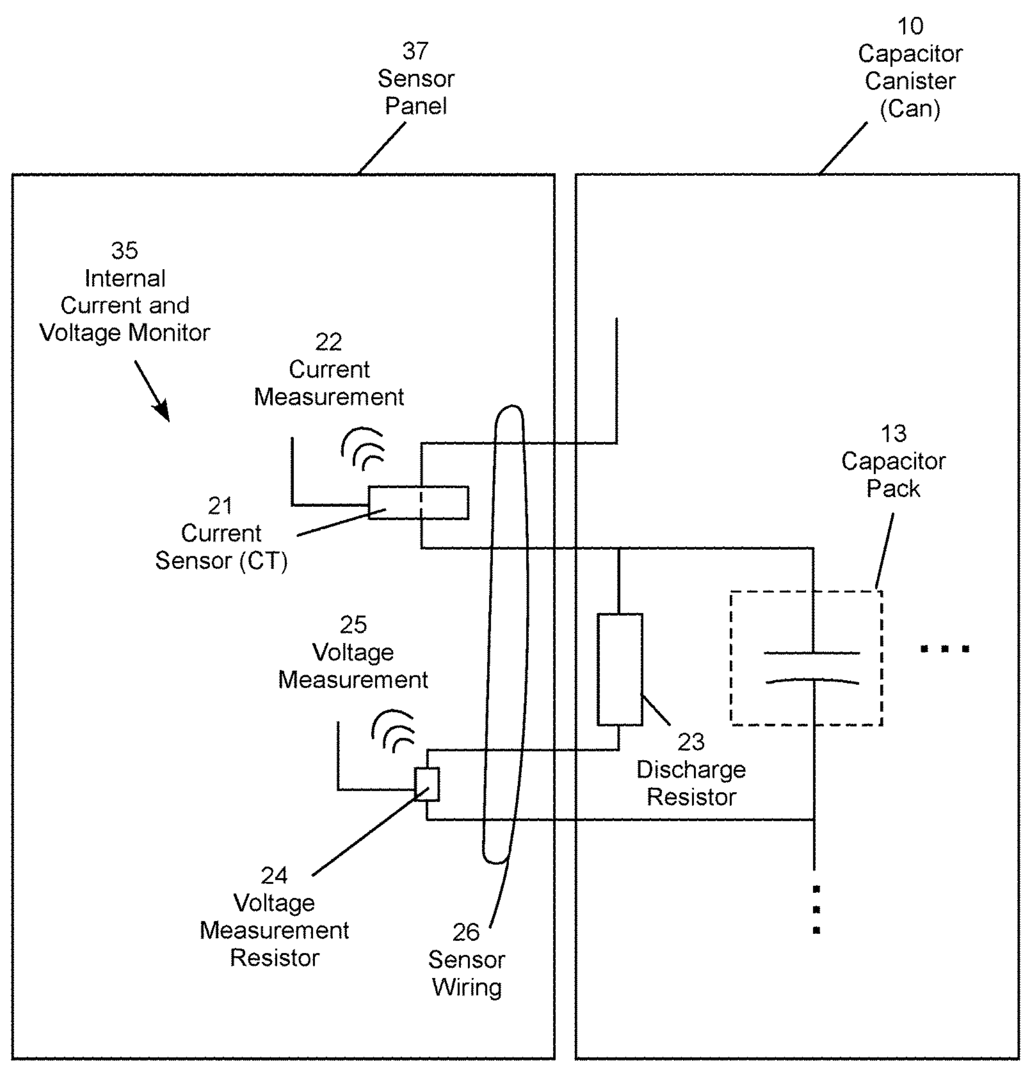
FIG. 3B is a conceptual illustration of internal current and voltage sensors for individual capacitor packs inside the canister.

FIG. 3B is a conceptual illustration of internal current and voltage sensors for a representative capacitor pack 13 inside the canister 10. The main power line through the capacitor pack 13 is diverted through a current measurement CT 21, which communicates a current measurement 22 through a wired or wireless link to the canister impedance monitor 16 or other suitable controller. Each capacitor pack 13 is typically connected in parallel to a relatively large high voltage discharge resistor 23 that allows the capacitor pack to safely discharge its stored charge when power is removed. The main power line through the discharge resistor 23 is diverted through a relatively small voltage measurement resistor 24 connected in series with the discharge resistor. A wired or wireless link communicates the voltage measurement 25 to the canister impedance monitor 16 or other suitable controller. The arrangement shown in FIG. 3B can be implemented as a retrofit modification to a preexisting canister only altering the canister with sensor wiring 26 routed to a separate sensor panel 37. The current sensors (CT) 22 and the voltage measurement resistors 24 with an associated wired or wireless links can then be conveniently located nearby without having to alter the size of the canister. As another option, the canister may be configured with internal sensors or a terminal block for connecting a external sensors to the canister.

Figure 4:
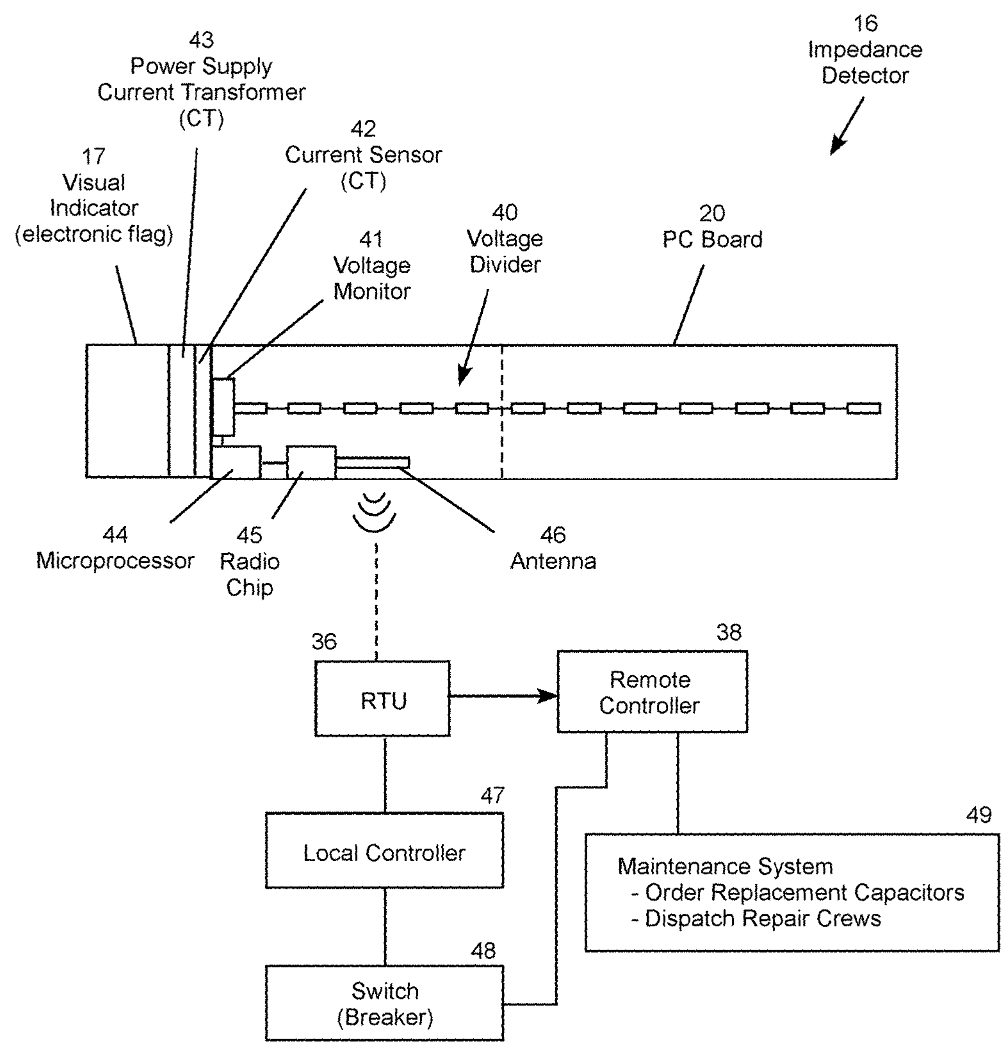
FIG. 4 is a conceptual top view of the impedance detector and functional block diagram of components operationally connected to the impedance detector.

FIG. 4 is a conceptual illustration of the impedance detector 16. This particular example includes a PC board 20 carrying a segmented voltage divider 40 connected to a voltage monitor 41, which measures the voltage drop across one or more (typically one) segments of the voltage divider. The impedance detector 16 also includes a current detector (CT) 42 measuring the current, typically in the milli-Amp range, flowing in the voltage divider. The impedance detector 16 further includes a current detector current transformer (CT) 43 providing power for operating the electronics of the impedance detector. Each current detector CT 42 and power supply CT 43 may be printed on the PC board or a disposed as a separate device positioned around one of the power line terminals. The voltage divider 40 is connected across the high voltage terminals of the capacitor canister in parallel with the internal capacitors of the canister. The impedance detector 16 also includes a microprocessor 44 and a radio chip 45 carried on the PC board 20. An antenna 46 may be a linear or patch antenna printed on the PC board 20 or configured as a separate device, such as a short barrel or whip type antenna, electrically connected to the PC board. The current sensor transformer 42 senses the current flowing in the power line through the capacitor canister and delivers that signal to the microprocessor 44. The impedance detector 16 may include an additional or alternative power source, such as a battery (e.g., backup battery). In this example, the power supply is a current transformer 43, which may be part of a separate current monitor for embodiments that include both current and voltage sensing.

The radio chip 45 and antenna 46 transmit impedance, voltage and in some embodiments current signals and other sensed or computed values to the remote transmission unit (RTU) 36. The RTU may relay monitored data or a trigger signal based on the monitored data to a local controller 47, which in turn controls local equipment, such as a switch or breaker 48. The controlled device may be operative for disconnecting the capacitor bank, or one or more segments of the capacitor bank, such as a balanced set of segments in each phase, from the power line in directly or indirectly in response to the monitored parameters from the impedance detector 16. The RTU 36 may alternatively or additionally communicate the monitored parameters with the remote or central controller 38 that may communicate with a maintenance system 49 to orders replacement parts and dispatches repair crews based directly or indirectly on the monitored parameters from the impedance detector 16. This allows partially failed capacitors canisters to be detected and replaced before they drop out of service or suffer major failures, such as explosive failures. The remote or central controller 38 may also operate the switch 38 if desired.

Figure 5:
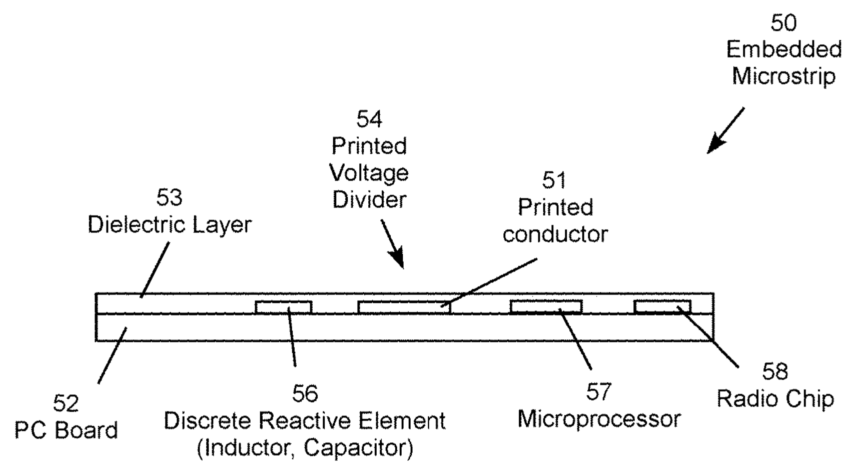
FIG. 5 is a conceptual top view of an embedded microstrip configuration the impedance detector.
Figure 6:
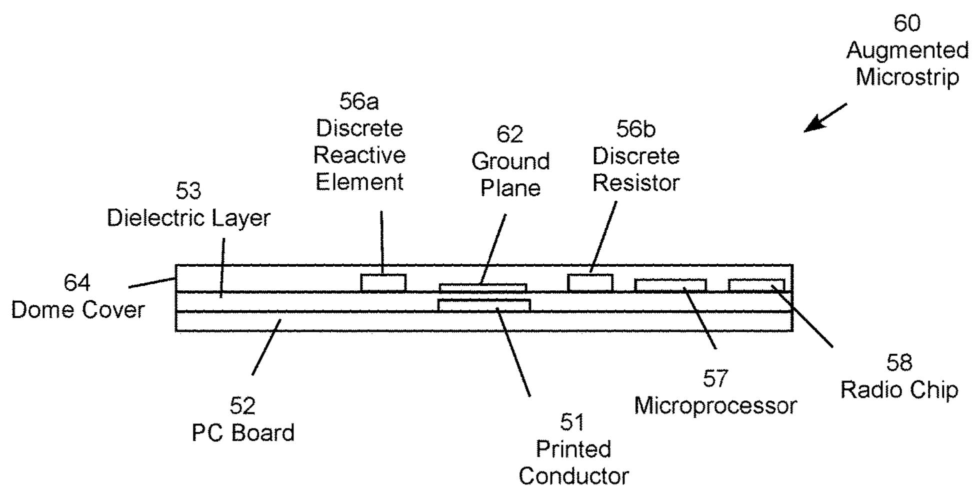
FIG. 6 is a conceptual top view of an augmented microstrip configuration the impedance detector.

The impedance detector 16 may utilize any suitable physical configuration, such as the embedded microstrip configuration 50 illustrated by FIG. 5, or the augmented microstrip configuration 60 illustrated by FIG. 6. The embedded microstrip configuration 50 shown in FIG. 5 includes an embedded conductor 51 printed the PC board 52 sandwiched between the PC board 52 and an overlying dielectric layer 53. The embedded conductor 51 forms the voltage divider 54 and may also define additional resistive and/or reactive circuit components 55. Additional discrete resistive and/or reactive circuit components 56, the microprocessor 57 and/or the radio chip 58 may likewise be sandwiched between the PC board 52 and the overlying dielectric layer 53. The embedded configuration protects the electric elements from the weather. The augmented microstrip configuration 60 illustrated by FIG. 6 varies in that a ground plane 62, discrete elements **56*a* and 56*b*, microprocessor 57 and/or radio chip 58 may be mounted on the PC board 52 or the dielectric layer 53, where they may be covered by a dome 64** to protect them from the weather.

Figure 7:
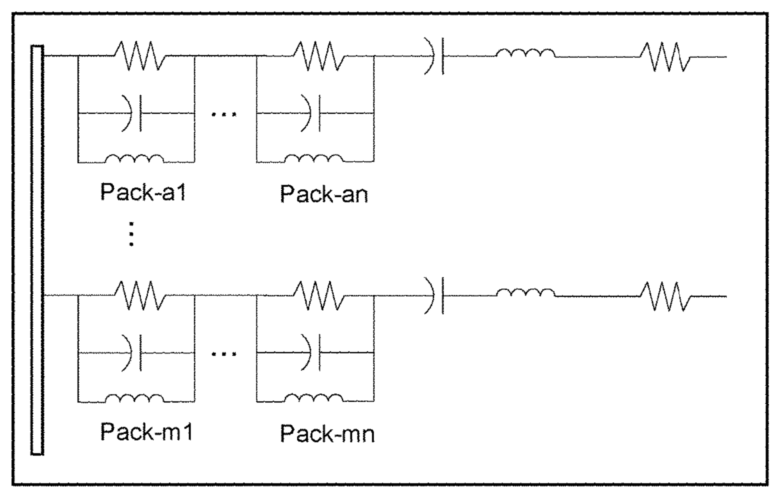
FIG. 7 is an equivalent electric schematic diagram of an illustrative impedance detector.

As shown in FIG. 7, the equivalent circuit of the impedance detector typically includes capacitive and inductive components in series and parallel with the main resistive characteristic of the divider to allow precise design. Combinations and variations of these and other suitable PC manufacturing techniques may be utilized as a matter of design choice. Monitoring the capacitor pack currents, as described with reference to FIG. 3, allows the equivalent circuit to reflect individual capacitor packs.

Figure 8:
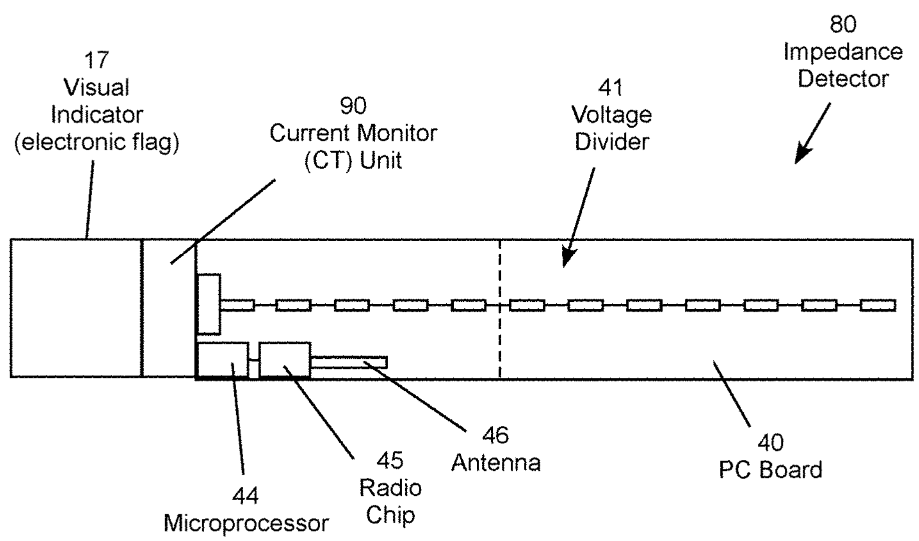
FIG. 8 is a conceptual top view of an alternative impedance detector including a current monitor.
Figure 9:
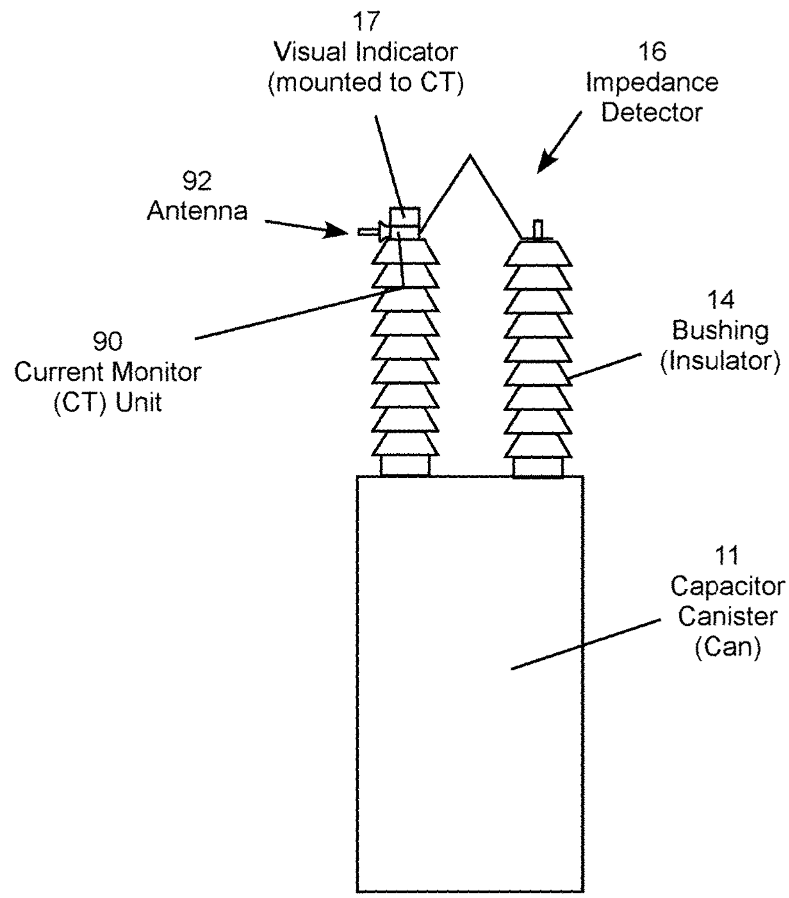
FIG. 9 is conceptual illustration of a high voltage capacitor with an impedance detector, current monitor, and visual indicator.
Figure 10:
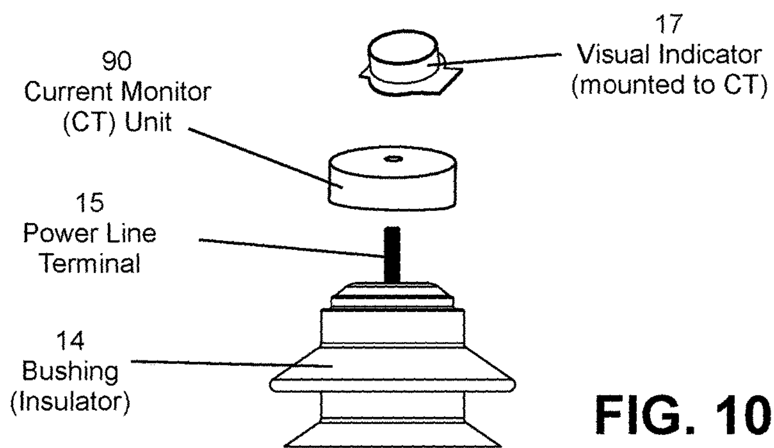
FIG. 10 is a conceptual illustration of a current monitor configured for mounting on a capacitor canister power terminal.
Figure 11:
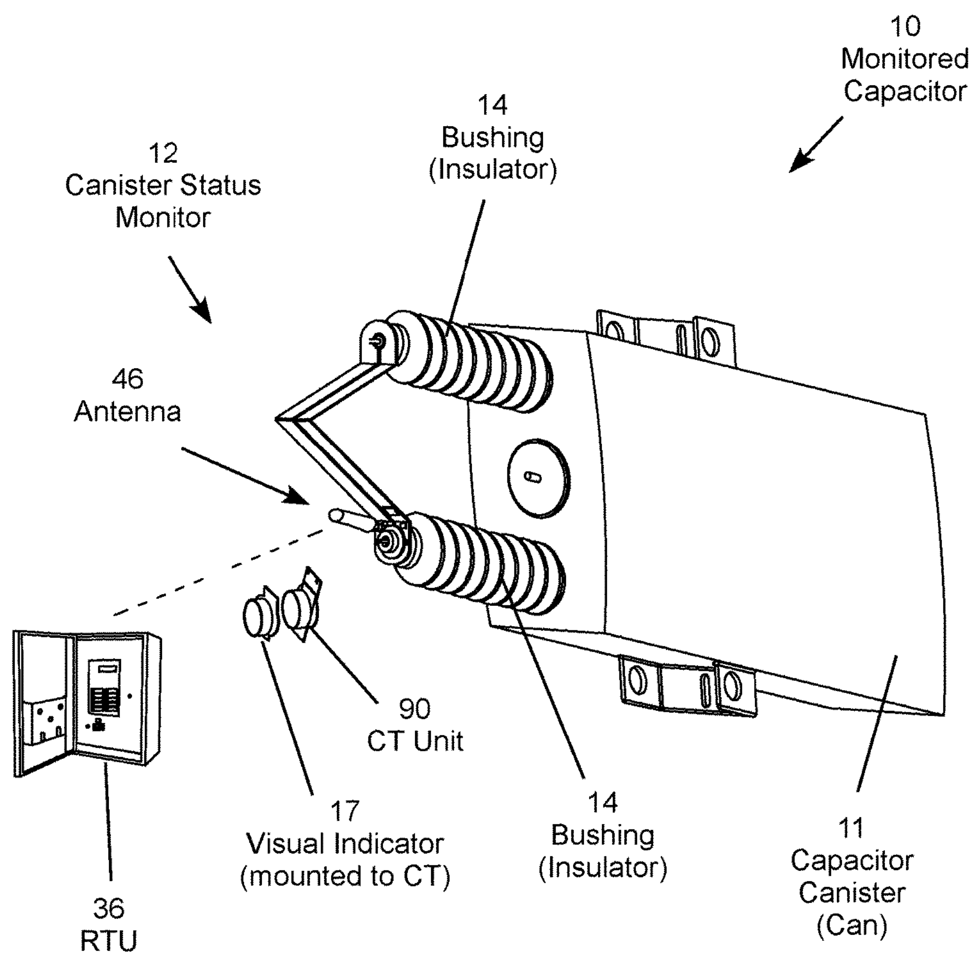
FIG. 11 is a conceptual perspective illustration of a capacitor canister with an impedance monitor and related components.

FIG. 8 illustrates another embodiment, in which the impedance detector 80 includes a visual indicator 82, a current monitoring unit 90, which combines a current monitor (CT), such as a Rogowski coil, and a power supply current transformer. As shown in FIGS. 9 and 10, the current monitor (CT) and the power supply current transformer 86 may be combined into an integrated CT unit 90 with an integral antenna 92 (i.e., an antenna provided as part of the CT unit 90) that slides or threads onto one of the power supply terminals of the capacity canister. The visual indicator 17 may also slide or thread onto the power terminal above the CT unit 90. As shown in FIG. 10, a self-contained CT 90 may be shaped like a puck configured for installation on the power line terminal at the end of the capacitor canister bushing 14. FIG. 11 shows an exploded view of this embodiment with a separate CT unit 90 and visual indicator 17 that fit on top of each other on one of the power line terminals at the end of the capacitor canister bushing 14. This particular embodiment utilizes an antenna connected to the impedance detector.

Figure 12:
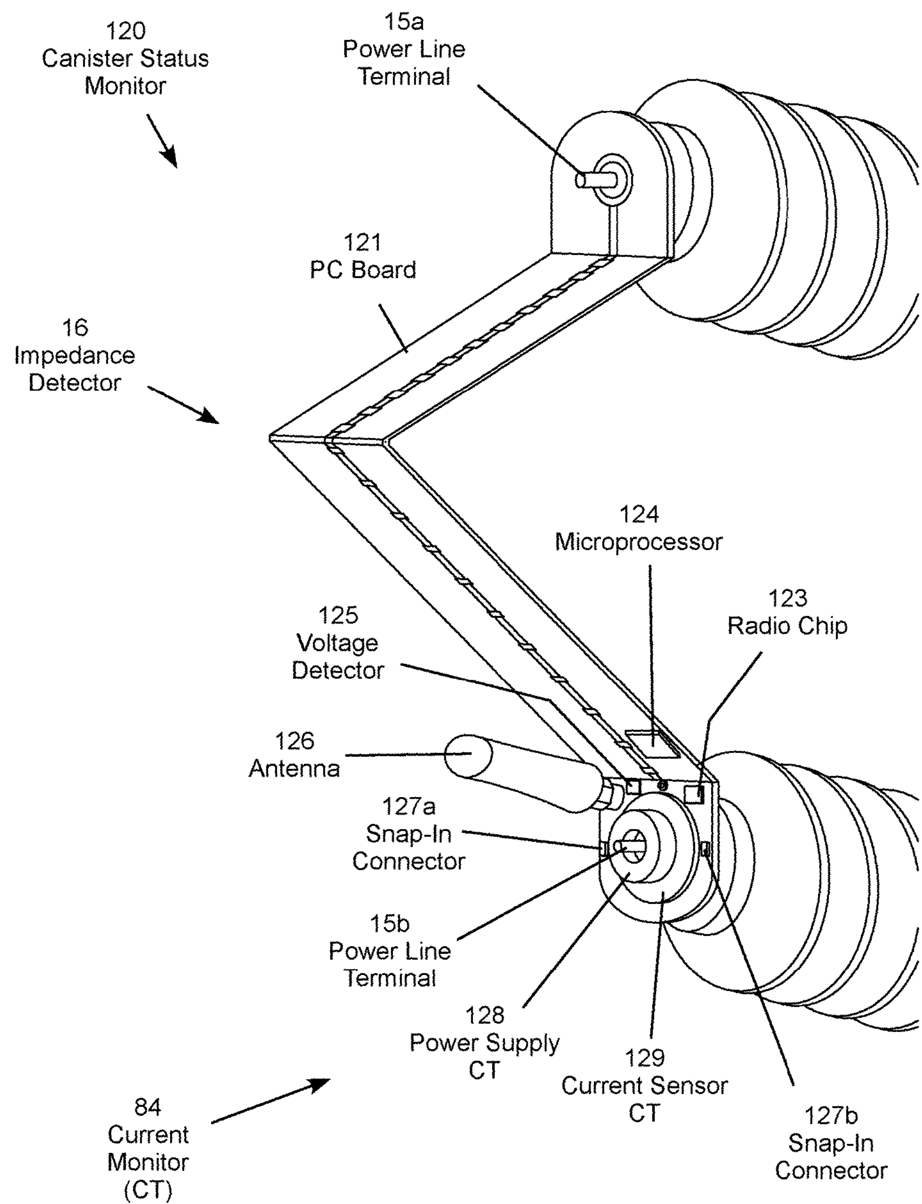
FIG. 12 a conceptual perspective view of the impedance monitor mounted on the top of insulators of the capacitor canister.

FIG. 12 shows a perspective view of an illustrative impedance detector 120 showing the PC board 121 carrying a voltage divider extending from the power line terminal **15*a* to the power line terminal 15*b*. The PC board carries a radio chip 123, microprocessor 124, voltage detector 125, and antenna 126. The PC board also includes snap-in connectors 127*a-b* for connecting a separate CT unit and/or visual indicator to the PC board. This particular embodiment also includes a power supply CT 128 and a current sensor CT 129 supported by the PC board of the impedance detector, which is an alternative configuration not relying on the separate CT unit 90 shown in FIGS. 9-10**. In this embodiment, the microprocessor and radio chip are carried on a main PC board and the current sensor is Rogowski coil printed on a satellite PC board suspended from the main PC board. The power supply current transformer includes a winding carried on a core supported by the housing below the satellite PC board.

As noted above, the voltage divider shown exposed in FIG. 12 may be embedded between the PC board and a dielectric material or covered by a dome to protect the electric elements from the weather. The electronic elements including the microprocessor and radio chip may be embedded or carried on either side of the PC board and covered or sealed to prevent keep water and other contaminants from reaching the chips or their conductor pins. In this embodiment, the power supply CT sits under the visual indicator and/or current monitor CT, which serves as a cover to shield the power supply CT from the weather elements. Although a post antenna is shown, other antenna types may be used, such as a linear or patch antenna printed on the PC board, a whip antenna, a vane antenna, or other suitable type of antenna.

Figure 13:
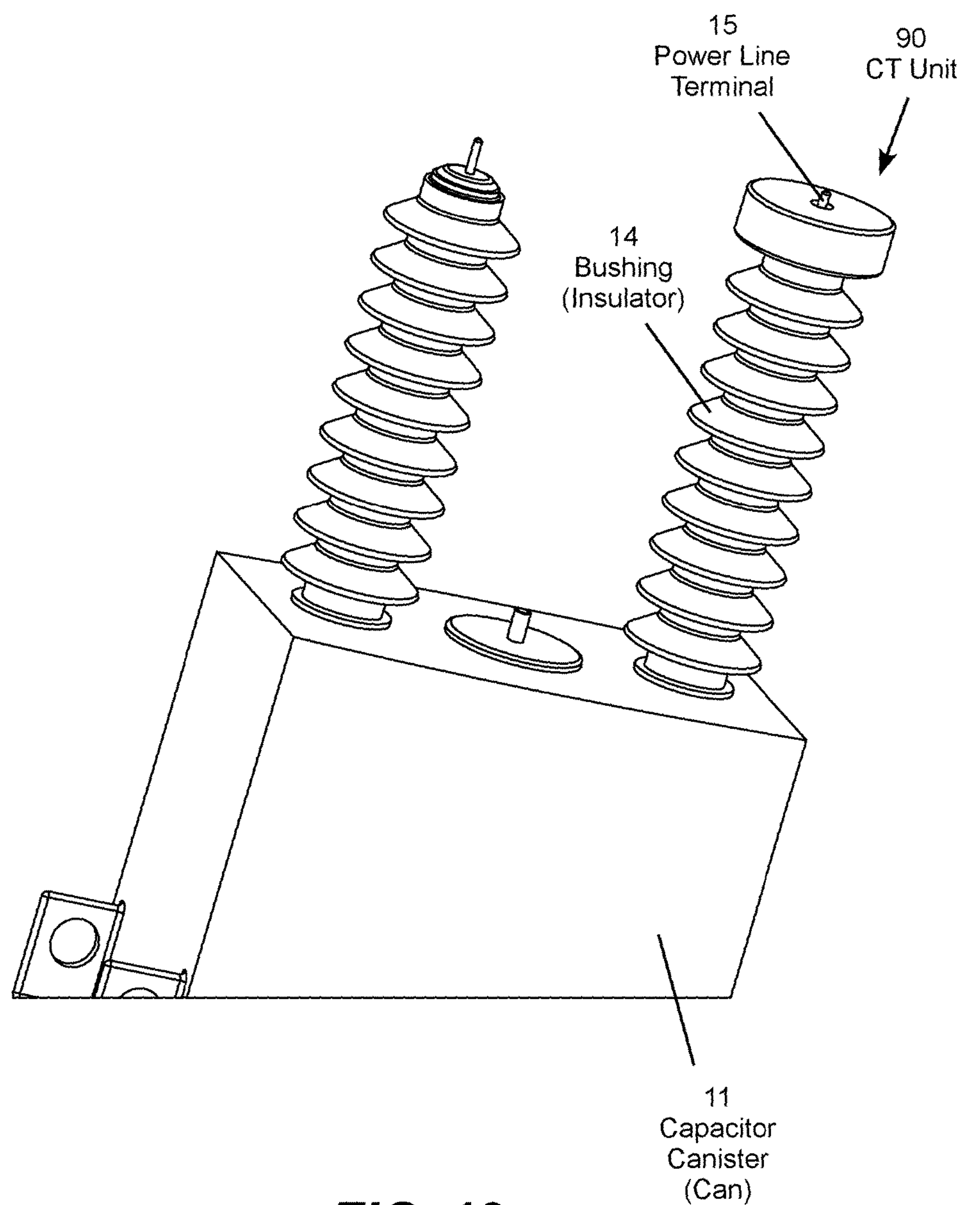
FIG. 13 is a conceptual perspective view of a capacitor canister with a current monitor mounted on the top of an insulator of the capacitor canister.
Figure 14:
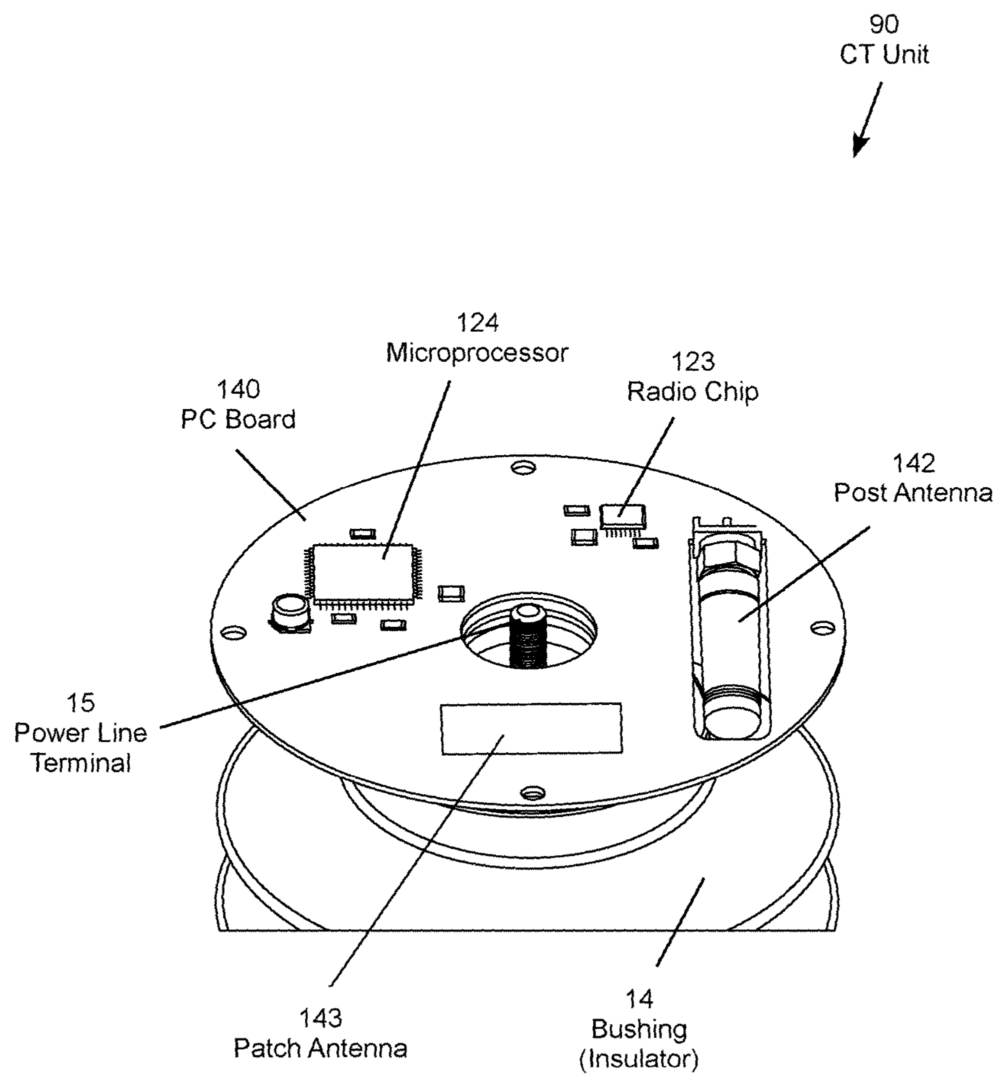
FIG. 14 is a conceptual perspective view of the current monitor with the housing removed to show internal components.
Figure 15:
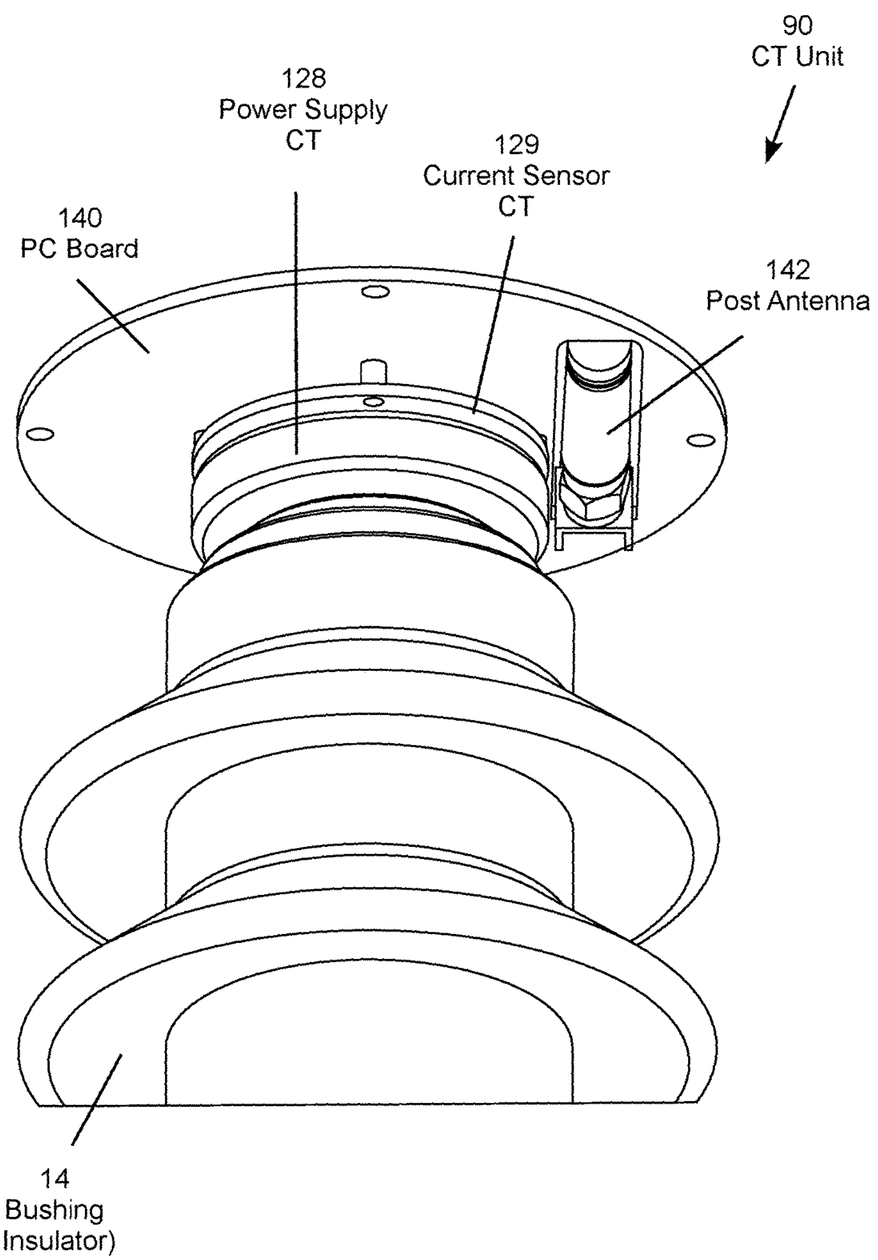
FIG. 15 is a conceptual perspective view of the underside of the current monitor.
Figure 16:
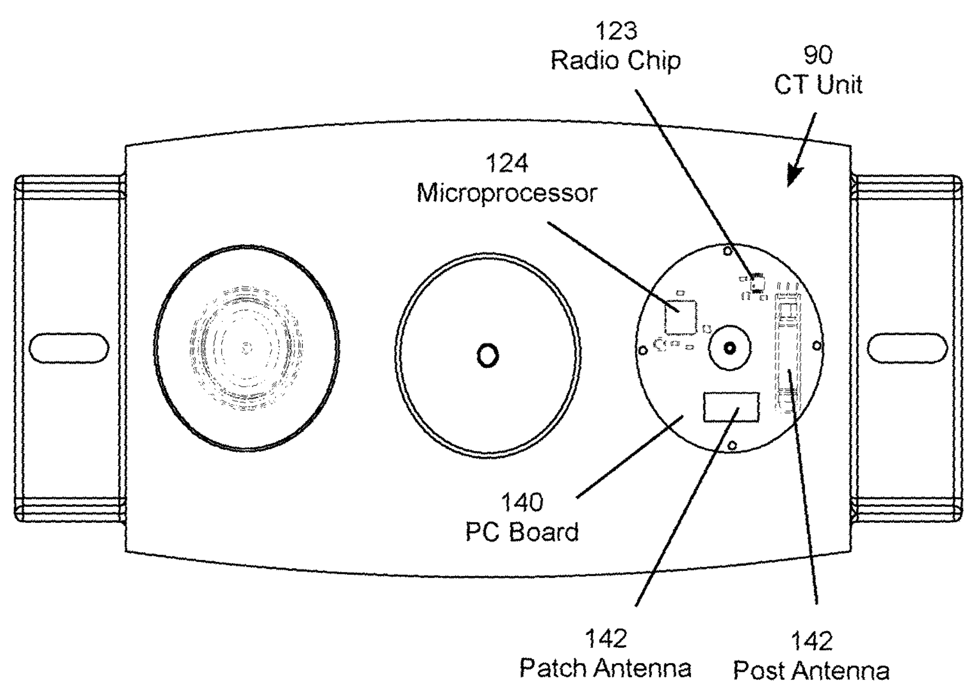
FIG. 16 is a conceptual top view of the capacitor canister with the housing removed from the current monitor to show internal components.
Figure 17:
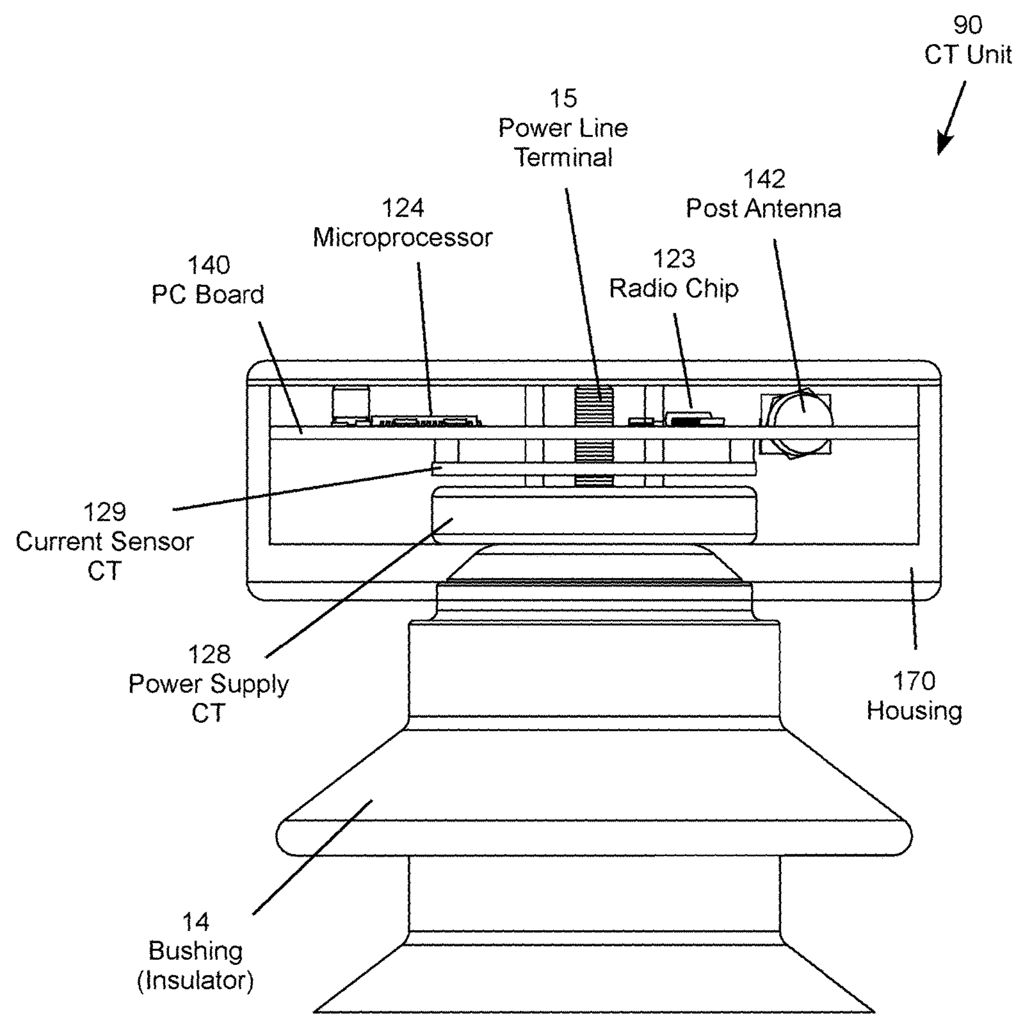
FIG. 17 is a conceptual side view of the current monitor with the housing partially removed to show internal components.
Figure 18:
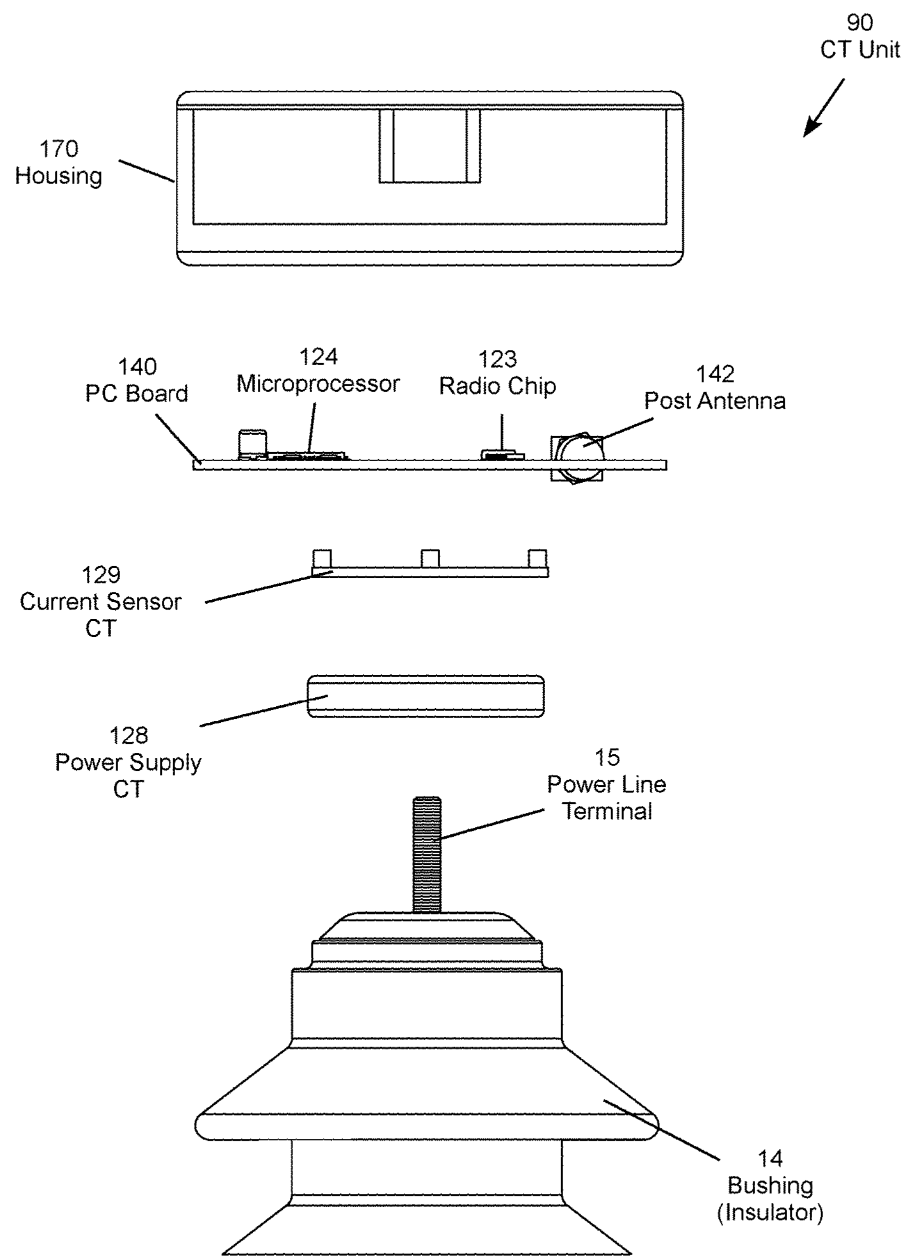
FIG. 18 is a conceptual side assembly view of the current monitor.

The current monitor CT unit 90 can be deployed with an impedance monitor, as shown in FIGS. 9-10, or independently as shown in FIG. 13, where the CT unit 90 is positioned on a bushing 14 of the capacitor can 10. FIGS. 14-18 show the interior components of the current monitor CT from several different views. The CT unit 90 includes a housing 170, a circular PC board 140 carrying a microprocessor 124 and a radio chip 123. The PC board is centrally disposed around the terminal 15 of the capacitor can 10. Two suitable alternatives of the antenna are illustrated, including a post antenna 142 and a patch antenna 143. The unit may include a post antenna 142 and a patch antenna 143 where the patch antenna is used for short distance communications (e.g., between capacitor status monitors), and the post antenna is uses for longer range communications (e.g., with an RTU or SCADA system). FIG. 15 shows the interior components of the current monitor CT from below including a current monitoring transformer (CT) 129, such as Rogowski coil carried on a circular satellite PC board positioned below the main PC board 142. A power supply current transformer 128 located below the Rogowski coil inductively derives operating power for the CT unit 90 from the power line. FIG. 17 is a side view of the CT unit 90 with the case shown in phantom, and FIG. 18 is an assembly view.

Figure 19:
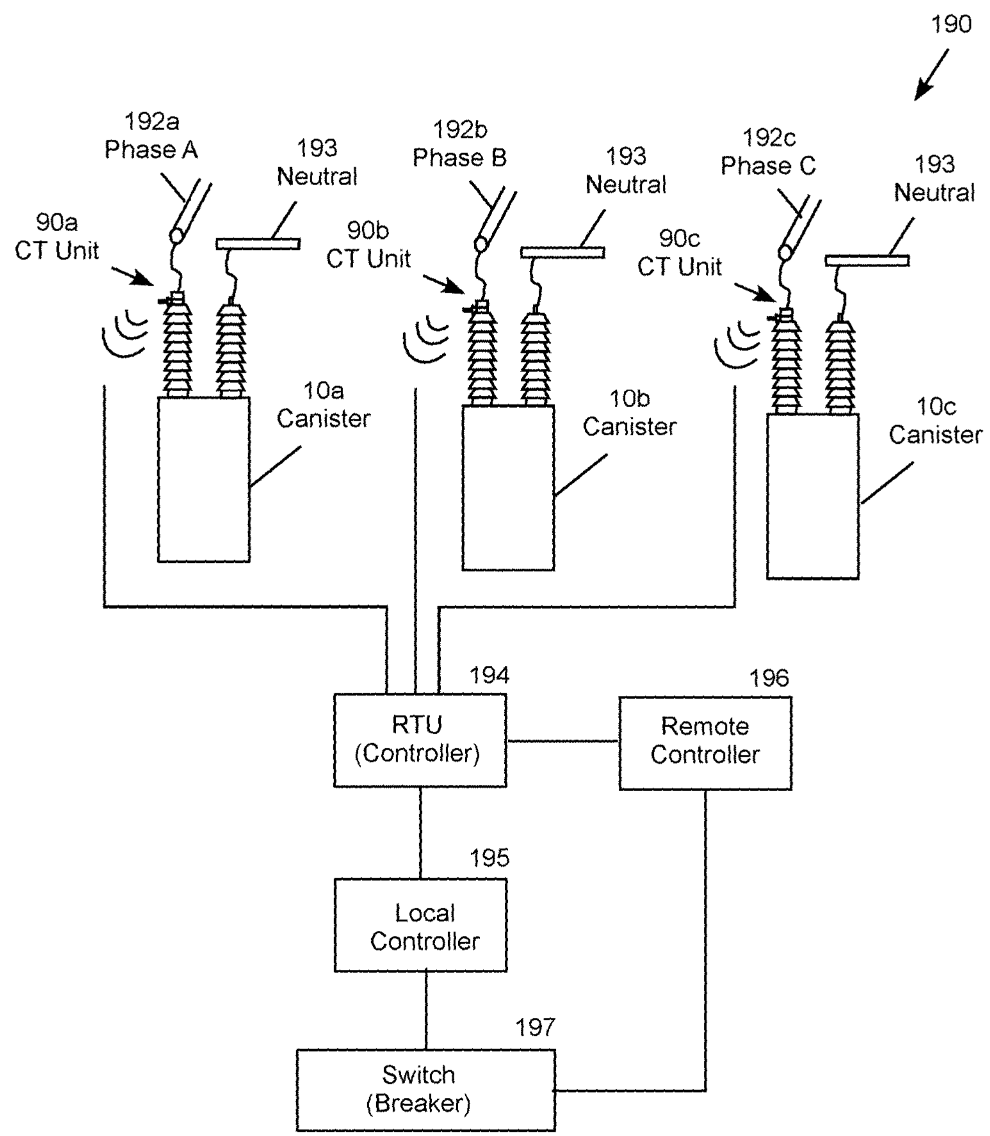
FIG. 19 is a conceptual illustration of a three-phase capacitor current monitoring, fault detection and response system.

FIG. 19 is a conceptual illustration of a three-phase capacitor current monitoring, fault detection and response system 190. The power line includes three phases **192*a* (Phase A), 192*b* (Phase B) and 192*c* (Phase C). Each phase line has a respective capacitor bank represented by the capacitor canisters 10***a*, 10*b* and 10*c* connected between the phase line and neutral 193 or ground (e.g., the ground bus). Each CT unit has a wired or wireless like to controller, which may in any suitable location. For example, the controller may be in the RTU 194, a local controller 195, or a remote controller 196. Wherever the controller may be located, it detects internal capacitor faults within the canisters 10*a-c* before they fail or drop off line and implements appropriate action. For example, the local controller 195 or the remote controller 196 mat operate the switch (breaker) 197 to disconnect a partially failed canister or schedule maintenance to have a partially failed canister replaced, typically during an off-peak period, as preventative maintenance.

Detecting the impedance of a particular capacitor canister to detect a partial failure ordinarily utilizes both a current and a voltage for the particular canister, as provided in the embodiments described with reference to FIGS. 1-12. In the embodiments described with reference to FIGS. 13-20, a partial canister failure can be detected with current measurements alone (i.e., without utilizing a voltage measurement or computing the impedance of the canister). FIG. 19 shows a configuration in which three current measurements are utilized to detect partial canister failure. The current measurements should be sampled simultaneously or time stamped to a common reference clock to allow for the reconstruction of synchronized current measurements. The three-phase currents on a power line typically sum to zero (or near zero) with close to balanced currents on each phase. However, capacitor failure occurring on only one phase imposes an abrupt capacitive imbalance between the phases, which results in an abrupt current imbalance on the phase lines. An abrupt change in capacitance can be readily distinguished from normal load fluctuations, which are usually caused by changes in resistive and inductive load changes. An abrupt change in the capacitive load is recognizable because it has a different phase angle from resistive and inductive load changes. The magnitude and phase angle of the current imbalance caused by an abrupt change in capacitance due to the failure of one or more capacitors within a capacitor pack therefore have distinctive signatures, which are defined and stored. These signatures are then compared to measured phase imbalances occurring on the power line to detect partial canister failures. In other words, the controller monitors the three phase currents to looks for abrupt current imbalances that have the magnitude and phase angle signature characteristic of a failure of one or more capacitors in the phase canister. This allows the number of failed capacitor packs and the associated phase to be readily detected.

Figure 20:
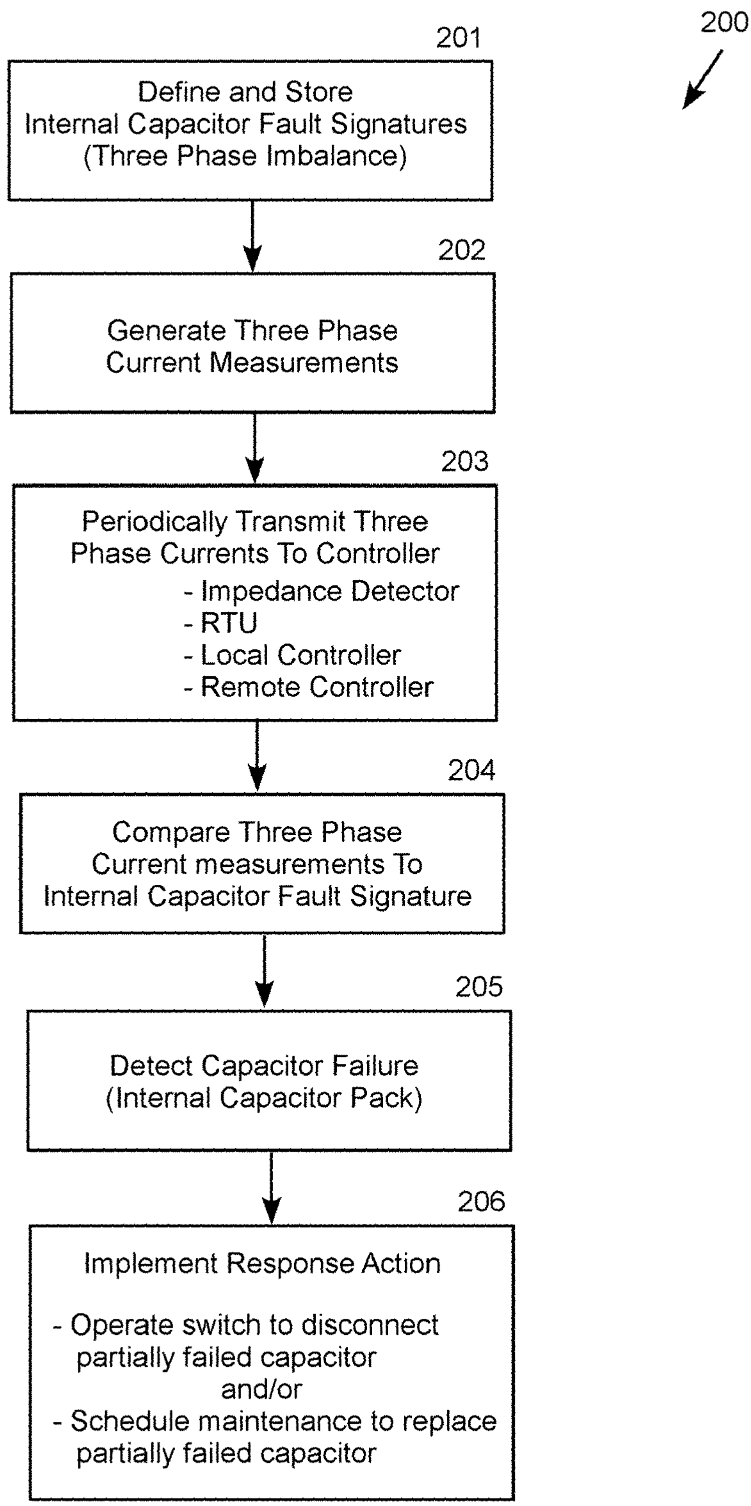
FIG. 20 is a logic flow diagram for the three-phase capacitor current monitoring, fault detection and response system.

FIG. 20 is a logic flow diagram 200 for the three-phase capacitor current monitoring, fault detection and response system. Routine 200 is typically performed by a capacitor fault detection controller (computer processor), which may be located in any suitable location. The controller receives the current measurements produced by the current transformer (CT) units on a synchronous basis or time-stamped to a common reference clock. The current measurements may be received periodically or received continuously and sampled periodically. In the following example, the current transformer (CT) units periodically transmit current measurements. In step 201, the three phase imbalance signatures of single and multiple capacitor failures within a capacitor canister are defined and stored. The three phase imbalance signatures represent sample-to-sample incremental three phase current changes characteristic of single and multiple capacitor failures within a capacitor canister. Step 201 is followed by step 202, in which the CT units generate three phase current measurements. Step 202 is followed by step 203, in which the three phase current measurements are periodically (e.g., every 50 milli-seconds) transmitted to a fault detection controller. The fault detection controller may be located in many different locations, such as an impedance detector, an RTU, a local controller, a remote controller, or any other suitable location. Step 203 is followed by step 204, in which the fault detection controller compares the sample-to-sample measured currents to the three phase imbalance signatures associated with single and multiple capacitor failures. Step 204 is followed by step 205, in which the fault detection controller detects a capacitor fault based on the comparison. Step 205 is followed by step 206, in which the fault detection controller initiates a response action, such as switching the partially failed canister out of service and/or scheduling the canister for replacement during an off-peak period.

In view of the foregoing, it will be appreciated that present invention provides significant improvements in monitoring and response systems for high voltage capacitors. The foregoing relates only to the exemplary embodiments of the present invention, and that numerous changes may be made therein without departing from the spirit and scope of the invention as defined by the following claims.

The invention claimed is:

1. A capacitor current monitor for a high voltage electric power capacitor canister having a first high voltage bushing carrying a first high voltage power line terminal, and a second high voltage bushing carrying a second high voltage power line terminal, comprising:

a housing configured for mounting on one of the power line terminals;

a current sensor carried by the housing positioned to surround the power line terminal when the housing is mounted on the power line terminal, the current sensor operative for detecting a current measurement of a current flowing through the power line terminal;

electronics carried by the housing including a microprocessor, a radio chip, and an antenna for transmitting information acquired or computed by the microprocessor;

a power supply current transformer carried by the housing positioned to surround the power line terminal when the housing is mounted on the power line terminal, the power supply current transformer operative for inducing electric power from the current flowing through the power line terminal and supplying the electric power to the electronics of the capacitor current monitor.

2. The capacitor current monitor of claim 1, further comprising a current fault controller configured to utilize three phase current measurements and signatures characteristic of single-capacitor and multi-capacitor faults to detect capacitor failures within the capacitor canister without requiring voltage or impedance measurements of the capacitor canister or individual capacitor packs inside the canister.

3. The capacitor current monitor of claim 1, wherein:

the microprocessor and radio chip are carried on a main PC board; and the current sensor is printed on a satellite PC board suspended from the main PC board.

4. The capacitor current monitor of claim 3, wherein the power supply current transformer comprises a winding carried on a core supported by the housing below the satellite PC board.

5. The capacitor current monitor of claim 4, wherein the antenna comprises a post located within the housing.

6. The capacitor current monitor of claim 4, wherein the antenna comprises a whip located outside and supported by the housing.

7. The capacitor current monitor of claim 1, wherein the antenna comprises a patch antenna printed on the main PC board.

8. The capacitor current monitor of claim 1, wherein the antenna comprises a post or whip antenna electrically connected to the PC board.

9. The capacitor current monitor of claim 1, further comprising a visual indicator operative for displaying a status of the capacitor based on the current measured by the current sensor.

10. The capacitor current monitor of claim 9, wherein the remote transmission unit is configured to transmit the status of the capacitor to a central controller, wherein the central controller is configured to operate a switch configured to disconnect the high voltage electric power capacitor canister from a high voltage electric power line based on the current measured by the current sensor to a remote transmission unit.

11. The capacitor current monitor of claim 1, further comprising a switch configured to disconnect the high voltage electric power capacitor canister from a high voltage electric power line based on the current measured by the current sensor to a remote transmission unit.

12. The capacitor current monitor of claim 1, further configured to communicate a status of the capacitor based on the current measured by the current sensor to a remote transmission unit.

13. A capacitor status monitor for a high voltage electric power capacitor canister having a first high voltage bushing carrying a first high voltage power line terminal, and a second high voltage bushing carrying a second high voltage power line terminal, comprising:

a current monitor comprising: a housing configured for mounting on one of the power line terminals, a current sensor carried by the housing positioned to surround the power line terminal when the housing is mounted on the power line terminal, the current sensor operative for detecting a current measurement of a current flowing through the power line terminal, electronics carried by the housing including a microprocessor, a radio chip, and an antenna for transmitting information acquired or computed by the microprocessor, a power supply current transformer carried by the housing positioned to surround the power line terminal when the housing is mounted on the power line terminal, the power supply current transformer operative for inducing electric power from the current flowing through the power line terminal and supplying the electric power to the electronics of the capacitor current monitor; and an impedance detector comprising: a PC board configured for connection between the first and second power line terminals comprising a voltage divider operative for detecting a voltage measurement of a voltage across the first and second power line terminals of the capacitor canister, and electronics comprising a microprocessor operative for computing an impedance associated with the capacitor canister based on current measurement and the voltage measurement; and wherein the power supply current transformer supplies electric power to the electronics of the impedance detector.

14. A capacitor status monitor of claim 13, wherein the antenna of the current monitor is operative for transmitting information acquired or computed by the microprocessor of the impedance detector.

15. The capacitor status monitor of claim 13, further comprising a visual indicator operative for displaying a status of the capacitor based on the impedance computed by the microprocessor.

16. The capacitor status monitor of claim 13, wherein the PC board comprises a "V" shape and a distance equal to or greater than two and one-half the distance between first and second power line terminals.

17. The capacitor status monitor of claim 13, wherein the voltage divider comprises a printed conductor carried on the PC board.

18. The capacitor status monitor of claim 13, wherein the PC board is configured as an embedded microstrip with a printed conductor positioned between the PC board and a dielectric layer adhered to the PC board.

19. The capacitor status monitor of claim 13, wherein the PC board is configured as an augmented microstrip with a printed conductor positioned carried on the PC board covered by a protective dome.

* * * * *